United States Patent [19]
Groen et al.

[11] Patent Number: 5,455,512
[45] Date of Patent: Oct. 3, 1995

[54] EDDY CURRENT COMPENSATION IN MAGNETIC RESONANCE IMAGING

[75] Inventors: Johannes P. Groen; Peter Van Der Meulen; Gerrit H. Van Yperen; Antoon F. Mehlkopf, all of Eindhoven, Netherlands

[73] Assignee: U.S. Philips Corporation, New York, N.Y.

[21] Appl. No.: 143,268

[22] Filed: Oct. 26, 1993

[30] Foreign Application Priority Data

Oct. 26, 1992 [EP] European Pat. Off. ............ 92203274.3

[51] Int. Cl.⁶ .................................................. G01R 33/48
[52] U.S. Cl. ................................................................ 324/309
[58] Field of Search .................................... 324/304, 307, 324/318, 322; 128/653.2, 653.5

[56] References Cited

U.S. PATENT DOCUMENTS

| | | | |
|---|---|---|---|
| 4,647,858 | 3/1987 | Bottomley | 324/320 |
| 4,698,591 | 10/1987 | Glover et al. | 324/307 |
| 4,823,084 | 4/1989 | McKinnon | 324/309 |
| 4,896,112 | 1/1990 | Ratzel et al. | 324/309 |
| 4,924,186 | 5/1990 | Kawamoto et al. | 324/320 |

FOREIGN PATENT DOCUMENTS

| | | |
|---|---|---|
| 0210562 | 2/1987 | European Pat. Off. ....... G01N 24/08 |
| 0309720 | 4/1989 | Germany . |
| 2144039 | 11/1988 | Japan . |
| 2144039 | 6/1990 | Japan . |

Primary Examiner—Sandra L. O'Shea
Assistant Examiner—Raymond Y. Mah
Attorney, Agent, or Firm—Jack D. Slobod

[57] ABSTRACT

In an MRI device operating according to a spin-echo method, switched gradient magnetic fields are applied in the form of slice selection, phase encoding and read gradients. The switching of the gradients causes eddy currents in metal parts of the apparatus. The eddy currents disturb the applied magnetic fields, thereby changing the phases of the precessing nuclear spins of a body to be examined and causing artefacts in a reconstructed image. The disturbing effects of the eddy currents is compensated for by supplementing a sequence of switched gradient magnetic fields with additional gradient fields. These additional fields have zero net effect but induce further eddy currents which compensate for the disturbing effects of the eddy currents generated by the regular switched gradient magnetic fields. The additional gradient fields are chosen such that the total time-integrated strength of a gradient in any interval between two RF-pulses is substantially equal to the desired value.

16 Claims, 4 Drawing Sheets

EDDY CURRENT COMPENSATION IN MAGNETIC RESONANCE IMAGING

BACKGROUND OF THE INVENTION

1. Field of the Invention

The invention relates to a method for magnetic resonance imaging of a body placed in a stationary and substantially homogeneous main magnetic field, the method including at least one measuring sequence comprising the application of an excitation radio-frequency pulse (RF-pulse) for excitation of nuclear dipole moments in at least a portion of the body, the application of at least one refocusing RF-pulse following said excitation RF-pulse and switched gradient magnetic fields for generating position dependent magnetic resonance signals in the excited portion. Such a sequence of RF-pulses is known as a spin-echo sequence and generates one or more nuclear magnetic resonance echo signals (NMR-signals) following the refocusing RF-pulses. The invention also relates to an apparatus for magnetic resonance imaging using such a method.

2. Description of the Related Art

Such method for imaging is known from EP-A 0 210 562. In the known method switched gradient magnetic fields are applied for encoding position information in the NMR-signals. The gradient fields provide slice selection, phase encoding and read gradients. As described in the cited EP-A 0 210 562, switching of the gradients causes eddy currents in the apparatus, which eddy currents generate magnetic fields of their own and disturb the applied magnetic fields. The disturbed magnetic fields lead to artefacts in a reconstructed image, which artefacts may exhibit themselves as local low level signal, local absence of signal in an image or the presence of ghosts in the image. In the known method the influence of eddy currents is compensated for by applying a cancelation gradient magnetic field pulse of a polarity opposite to that of the gradient pulse to be compensated. The applied cancellation gradient magnetic field pulses are constant or approximate the decaying eddy current magnetic fields, at least during data acquisition.

In the known method gradient magnetic fields are added to a measuring sequence in a way that the total time-integrated strength, or gradient area, in an interval between RF-pulses is changed. As these correction fields generate eddy currents themselves, and because of the change in gradient area, the known method is not appropriate for a spin-echo sequence in which a plurality of magnetic resonance signals is generated by repeated application of refocusing RF-pulses following a single excitation RF-pulse. The Carr-Purcell-Meiboom-Gill (CPMG) sequence is such a sequence. A CPMG sequence requires that the phase of a precessing nuclear dipole moment is the same at each refocussing RF-pulse, this condition of equal phase is referred to as the CPMG condition.

SUMMARY OF THE INVENTION

It is, inter alia, an object of the invention to provide a magnetic resonance method in accordance to the introductory paragraph in which effects of eddy currents are reduced in a manner that allows multiple spin-echo sequences.

Thereto, the method according to the invention is characterised in that the measuring sequence comprises an additional switched gradient magnetic field or a plurality of additional switched gradient magnetic fields, having an imposed gradient shape such that the time-integrated strength between RF-pulses of said imposed gradient shape satisfies the CPMG condition, said additional switched gradient field or fields further being dimensioned for causing eddy currents such that the combined effects upon the phases of excited nuclear dipole moments due to eddy currents caused by switched gradient fields for generating position dependent signals and by said additional switched gradient magnetic field or fields, time-integrated between a pair of RF-pulses, satisfies the CPMG condition. The invention is based upon the insight that the CPMG condition of equal spin phases at each refocusing RF-pulse can be fulfilled by generating additional eddy currents, such that the total time-integrated effect between two RF-pulses of all eddy currents in a particular gradient direction has no influence to the way the CPMG condition is satisfied. For example, the net contribution of the eddy current fields is made zero. The additional eddy currents are caused by the additional gradient fields. As care is taken that the imposed or ideal shape of any gradient area added in intervals between RF-pulses fulfils the CPMG condition, the additional gradient fields themselves have no influence. This method has the advantage that it is rather insensitive to the amplitude of the eddy currents effect in the apparatus and to spatial variations thereof. A larger eddy current fraction in a particular gradient direction at a particular position will have comparable effects upon the eddy currents of the normal and additional gradient fields.

A first embodiment of the method according to the invention is characterised in that one additional switched gradient magnetic field is applied prior to the excitation RF-pulse. The eddy currents generated by these gradients "spill over" into the interval between the excitation RF-pulse and the first refocusing RF-pulse. This provides a compensation for the eddy currents due to the normal gradients in this interval. As the additional gradient field, prior to the excitation RF-pulse, does not influence the phases of precessing nuclear spins, the time-integrated strength of this additional gradient field may be different from zero. It is remarked that it is known per se from "Patents abstracts of Japan", vol. 14, no. 386, page 122C750, Kokai No. 2-144039, to apply a gradient field prior to an excitation RF-pulse. However, in this case the added gradient RF-pulse is intended for cancelling an eddy current magnetic field, not for compensating the time-integrated effects of eddy currents on the phase of precessing nuclear dipole moments in a spin echo sequence.

A preferred embodiment of the method according to the invention is characterised in that a plurality of additional switched gradient magnetic fields is applied prior to the excitation RF-pulse, the additional switched gradient magnetic fields having different strength and length. Several additional gradient fields having different timing and strength generate eddy currents of different amplitude and in earlier or later stages of the decay. Herewith it is possible to optimise the total compensation eddy current to a range of different time constants.

The strengths and lengths of the additional gradient fields can be optimised analytically or numerically, i.e. by parameterisation of the apparatus and the assumed eddy current behaviour and the behaviour of the induced magnetic fields, and by calculating which shapes and time-integrated strengths of the additional gradient magnetic fields provide best results for a certain range of time constants that may exist in the actual system. A further embodiment of the method according to the invention is characterised in that a pair of additional switched gradient magnetic fields is applied in between RF-pulses, the additional switched gradient magnetic fields having opposite polarity. In this manner a further adjustment of the compensating eddy currents, due to the additional gradient fields, is obtained. As the additional gradient fields are in the same direction as the normal switched gradient fields, the additional gradient fields are likely to take the form of a modification of the normal gradients by increasing or decreasing the strength of such normal gradient fields.

Methods for magnetic resonance imaging sequences usually comprise sequences with phase encoding gradients that have time-integrated strengths varying between magnetic resonance signals. If the total number of magnetic resonance signals to be measured for an image is larger than the maximum number that can be measured in a single sequence, sequences which are different in respect to their phase-encoding gradients are contained in a full measurement. An embodiment of such a method is characterised according to the invention in that the additional switched gradient magnetic fields are adapted to the varying time-integrated strengths of the phase-encoding gradient magnetic fields. Each of the different sequences is optimised with respect to eddy current behaviour.

A preferred embodiment of the method according to the invention is characterised in that the additional switched gradient magnetic field or fields are dimensioned for providing a compensation of eddy currents caused by said switched gradient fields for generating position dependent signals in which the eddy currents have decay time constants of about 4 milliseconds and more. It appears that most relevant eddy current effects in an MRI apparatus fade away with decay times from about 5 ms upwards. By providing a measuring sequence with additional gradients that provide proper compensation for decay times of 4 ms and longer, the same sequence can be used on different MRI devices without adaptation to the specific properties of each individual MRI device.

The invention also relates to an apparatus for performing a method as described hereinbefore, the apparatus for magnetic resonance imaging of a body placed in a stationary and substantially homogeneous main magnetic field, comprising means for establishing the main magnetic field, means for generating gradient magnetic fields superimposed upon the main magnetic field, means for radiating RF-pulses towards a body placed in the main magnetic field, control means for steering the generation of the gradient magnetic fields and the RF-pulses, and means for receiving and sampling magnetic resonance signals generated by sequences of RF-pulses and switched gradient magnetic fields, said control means being arranged for applying an excitation RF-pulse for excitation of nuclear dipole moments in at least a portion of the body, and for applying a plurality of refocusing RF-pulses following said excitation RF-pulse and switched gradient magnetic fields for generating position dependent magnetic resonance signals in the excited portion. According to the invention the apparatus is characterised in that said control means being further arranged for applying an additional switched gradient magnetic field or a plurality of additional switched gradient magnetic fields, having an imposed gradient shape such that the time-integrated strength between RF-pulses of said imposed gradient shape satisfies the CPMG condition, whereby said additional switched gradient field or fields further being dimensioned for causing eddy currents such that the combined effects upon the phases of excited nuclear dipole moments due to eddy currents caused by switched gradient fields for generating position dependent signals and by said additional switched gradient magnetic field or fields, time-integrated between a pair of RF-pulses, satisfies the CPMG condition.

These, and other more detailed aspects of the invention will now be elucidated by way of example with reference to the accompanying drawings.

BRIEF DESCRIPTION OF THE DRAWINGS

The drawings illustrate in

DETAILED DESCRIPTION OF THE PREFERRED EMBODIMENTS

Figure 1:
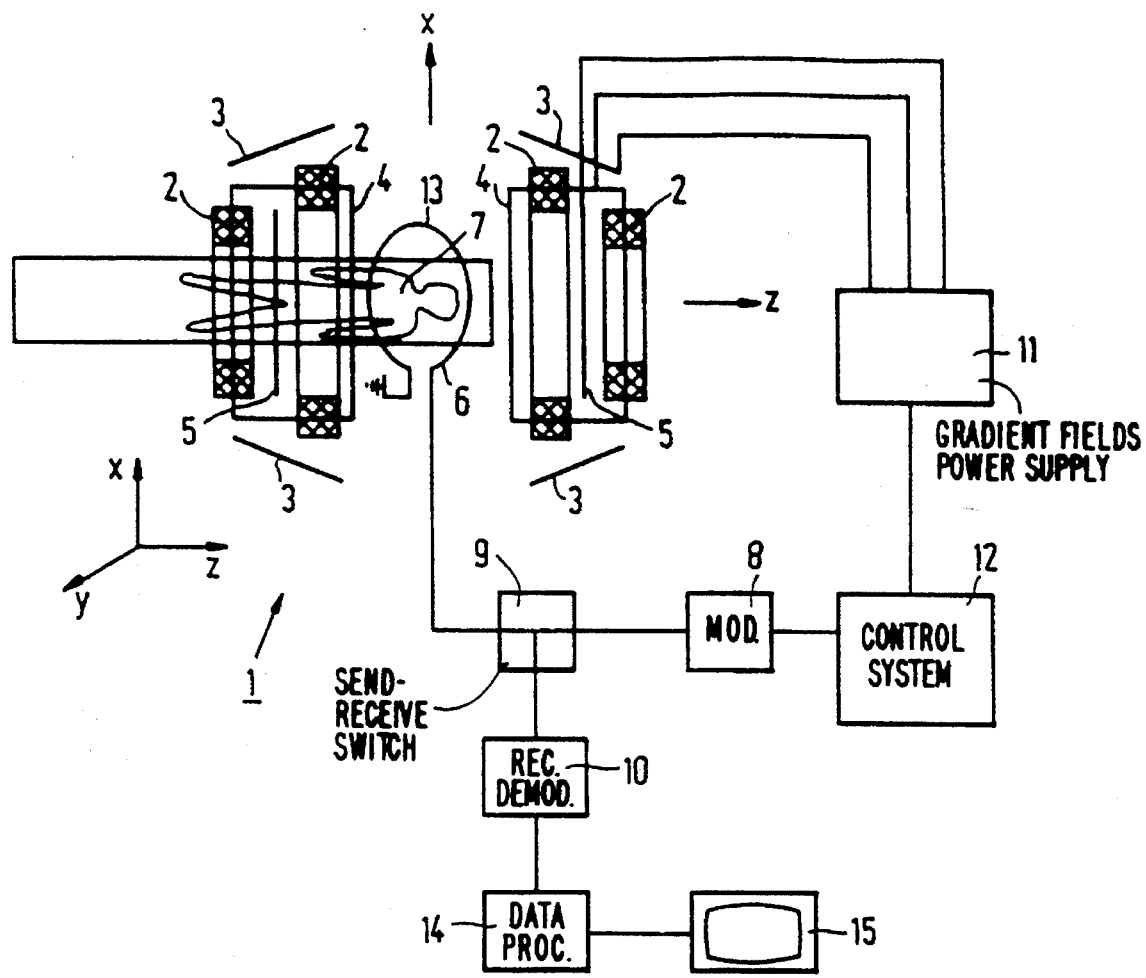
FIG. 1 diagrammatically a magnetic resonance imaging apparatus in which the invented method may be applied.

In FIG. 1 a magnetic resonance apparatus 1 is diagrammatically shown. The apparatus comprises a set of main magnetic coils 2 for generating a stationary and homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energised via a power supply 11. The apparatus further comprises emitting means in the form of an RF-coil 6 for emitting radio-frequency pulses (RF-pulses) to an object or body 7, the radiation means being coupled to a modulator 8 for generating and modulating of the RF-pulses. Also provided are means for receiving the NMR-signals, these means can be the RF-coil 6 or be a separate RF-coil. If the emitting and receiving means are the same, as shown in FIG. 1, a send-receive switch 9 is arranged to separate the received signals from the pulses to be emitted. The received NMR-signals are input to receiver-demodulator 10. The modulator 8 and the power supply 11 for the gradient coils 3, 4 and 5 are steered by a control system 12 to generate a predetermined sequence of RF-pulses and gradient field pulses. The receiver-demodulator is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetisation $M_0$ in the material of the body 7, directed in parallel with the magnetic field. In the apparatus 1 the macroscopic magnetisation $M_0$ is manipulated by radiating to the body RF-pulses having a frequency equal to the Larmor frequency of the nuclei, thereby bringing the nuclear dipole moments in an excited state and re-orienting the magnetisation $M_0$. By applying the proper RF-pulses, a rotation of the macroscopic magnetisation is obtained, the angle of rotation is called the flip-angle.

The intentional introduction of variations in the magnetic field by applying gradient magnetic fields influences the behaviour of the magnetisation locally. After the application of RF-pulses, the changed magnetisation will strive to return to a state of thermal equilibrium in the magnetic field, emitting radiation in the process. A well chosen sequence of RF-pulses and gradient field pulses causes this radiation to be emitted as NMR-signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M. A. Foster and J. M. S. Hutchinson, 1987, IRL Press.

Figure 2:
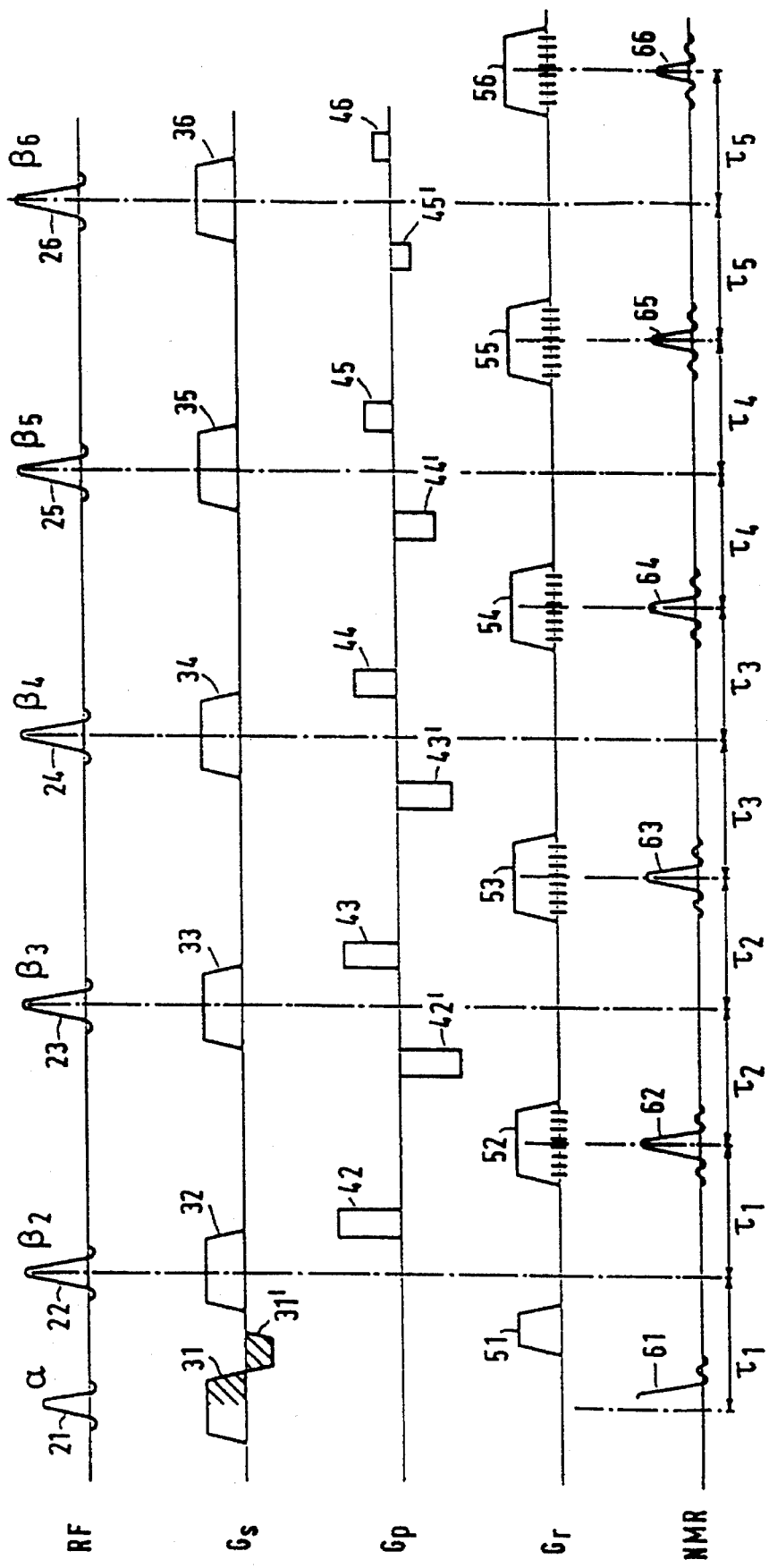
FIG. 2 a CPMG sequence with diagrammatic indications of an excitation RF-pulse, a plurality of refocusing RF-pulses, gradient magnetic fields and the occurrence of spin-echo signals as a function of time.

FIG. 2 shows a sequence of RF-pulses and magnetic field gradients for obtaining multiple spin-echo NMR-signals following a single excitation pulse. In the upper line RF the start of the sequence is indicated with an excitation RF-pulse 21 having a flip-angle $\alpha$, followed after an interval $\tau_1$ by a first refocusing RF-pulse 22 having a flip-angle $\alpha_2$. In a CPMG sequence the values of $\alpha$ and $\beta_2$ are often chosen to be 90° and 180°, respectively. Sequences with flip-angles deviating from these values are, however, possible. Following the excitation RF-pulse 21, a free induction decay (FID) nuclear magnetic resonance signal 61, indicated on the lower line NMR, is generated which vanishes rapidly when the individual precessing nuclear magnetic dipole moments lose phase coherence due to local variations in the magnetic field. The refocusing RF-pulse 22 reverses the direction of these individual magnetic dipole moments without affecting the local magnetic field. Consequently, the dephasing is reversed into a rephasing resulting after an equal interval $\tau_1$ in the occurrence of a NMR spin-echo signal 62. After the spin-echo signal 62 the dipole moments dephase again. Repetition of refocusing RF-pulses 23, 24, 25 and 26, with flip-angles $\beta_i$, i=3, . . . , 6, normally of 180°, cause subsequent reversals of the dephasing and the repeated occurrence of NMR spin-echo signals 63, 64, 65 and 66. The interval lengths $\tau_2$, $\tau_3$, $\tau_4$ and $\tau_5$ between a spin-echo signal and the next refocusing RF-pulse are chosen in the CPMG sequence to be equal in length.

The effect of the RF-pulses is made selective to a portion of the body 7 by applying, for example, simultaneously with the RF-pulses a slice selection gradient, which is indicated on the second line $G_s$ in the Figure. As indicated by 31 the slice selection gradient is first applied during the excitation RF-pulse 21. The dephasing caused by this first gradient 31 is compensated by an opposite gradient 31'. Also during the application of the refocusing RF-pulses 22–26 slice selection gradients 32–36 are switched on. For position determination within the selected slice, phase encoding gradient pulses 42, 43, 44, 45 and 46 with the gradient direction within the selected slice, indicated on the third line $G_p$, are applied in the interval between the RF-pulse and the NMR spin-echo signals 62, 63, 64, 65 and 66. In addition, frequency encoding or read gradients 52, 53, 54, 55 and 56, indicated on the fourth line $G_r$, having a gradient direction also within the selected slice but perpendicular to the gradient direction of the phase encoding field, are switched on during the occurrence of the spin-echo signals. The dephasing effects of the phase encoding gradients is removed after the occurrence of the spin-echo signals by applying further gradient pulses 42', 43', 44', 45' with the same time-integrated strength but with the gradient direction opposite compared to the preceding gradient pulses 42, 43, 44, 45, respectively. The dephasing effect of the read gradients 52, 53, 54, 55 and 56 is compensated for by the refocusing RF-pulses. A compensation read gradient 51, applied in the interval in between the excitation RF-pulse 21 and the first refocusing RF-pulse 22, provides initial dephasing of the spins in the read direction. This compensation read gradient 51 has half the time-integrated strength of the read gradients 52, 53, 54, 55 and 56.

During the occurrence of a spin-echo signal, the signal is sampled a number of times, 256 is a usual number, as indicated by the sampling arrays in the read gradient pulses in FIG. 2. By means of quadrature detection, each of the samples provides an in-phase and a 90°-phase shifted signal or, alternatively phrased, each sample yields the real and imaginary components of a complex NMR-signal value.

Figure 3:
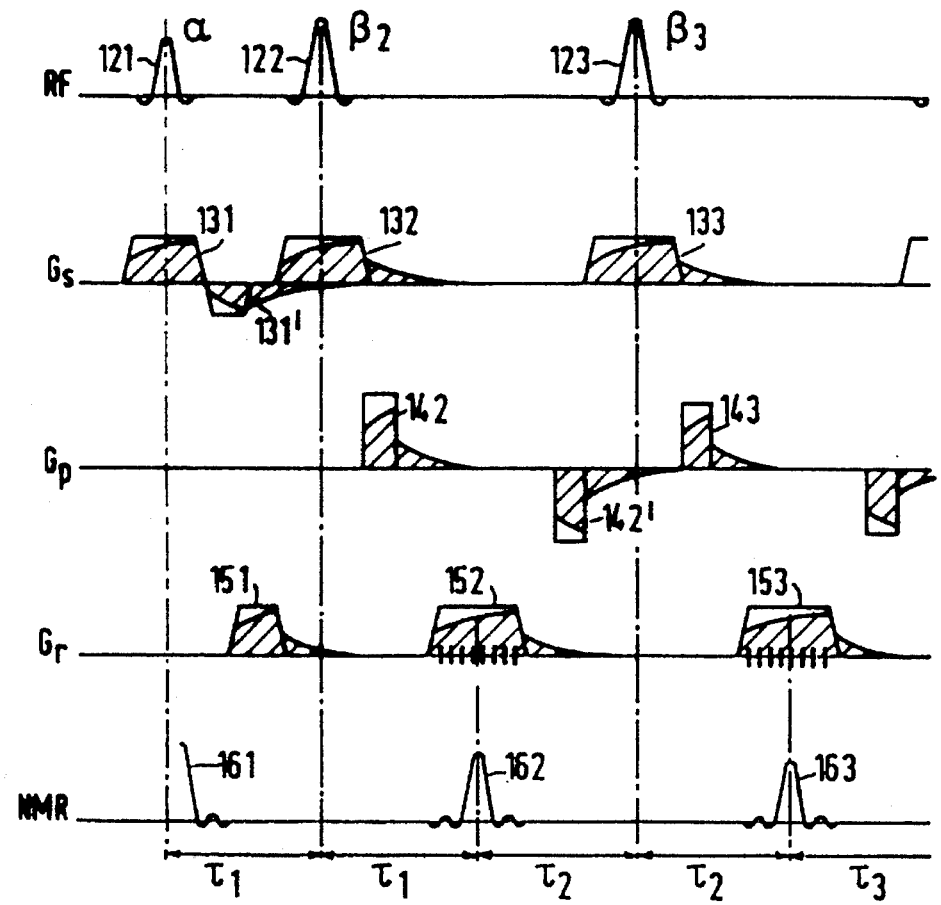
FIG. 3 a possible effect of eddy currents upon the effective strength of the normal magnetic gradient fields as a function of time.

In order to have a sequence which provides useful results, it is essential that the phases of a precessing nuclear dipole moment is the same at the occurrence of each refocusing RF-pulse. However, the switching of the gradient magnetic fields $G_s$, $G_p$ and $G_r$ induce eddy currents in conducting elements of the MRI apparatus. As the eddy currents in turn generate magnetic fields which decay in time when the eddy currents die out, the net shape of the gradient fields deviate from the desired or ideal shape. In particular, the gradient fields have transitional effects having tails which extend in time over the next refocusing RF-pulse or over a number of RF-pulses. This is shown in FIG. 3, which shows the gradient fields $G_s$, $G_p$ and $G_r$, including a possible effect due to eddy currents with a rather short decay time. The RF-pulses and gradient fields in this figure are indicated by reference numbers that are 100 above the numbers used for the similar RF-pulses and gradient field pulses as shown in FIG. 2. Indicated by the rectangular and trapezoid outlines are the ideal gradient pulse shapes as imposed by the system while the shaded areas indicate the effective gradient pulse including the effects of eddy currents. As is shown in the line $G_s$, the slice selection gradients 131 and 132 are changed in that their strengths during the RF-pulses is too small and in that the compensating gradient 131' has a tail which extends across the first refocusing RF-pulse 122. The net effect is that the time integrated strength between the excitation RF-pulse 121 and the first refocusing RF-pulse 122 is changed and that a complete compensation of spin phases by compensating gradient 131' is not obtained. In the line $G_p$ the phase encoding gradient 142 has a tail extends into the NMR signal and the opposite phase encoding gradient 142' has a tail that extending across the second refocusing RF-pulse 123. As the time-integrated strength of the phase encoding gradients in between the first and second refocusing RF-pulses 122 and 123 is not zero, the phases of a precessing nuclear dipole moment at the first and second refocusing RF-pulses 122 and 123 are unequal, causing artefacts in the finally reconstructed image. A similar situation occurs for the read gradient $G_r$, in which the compensating gradient magnetic field 151 has a tail extending through the first refocusing RF-pulse 122.

Figure 4:
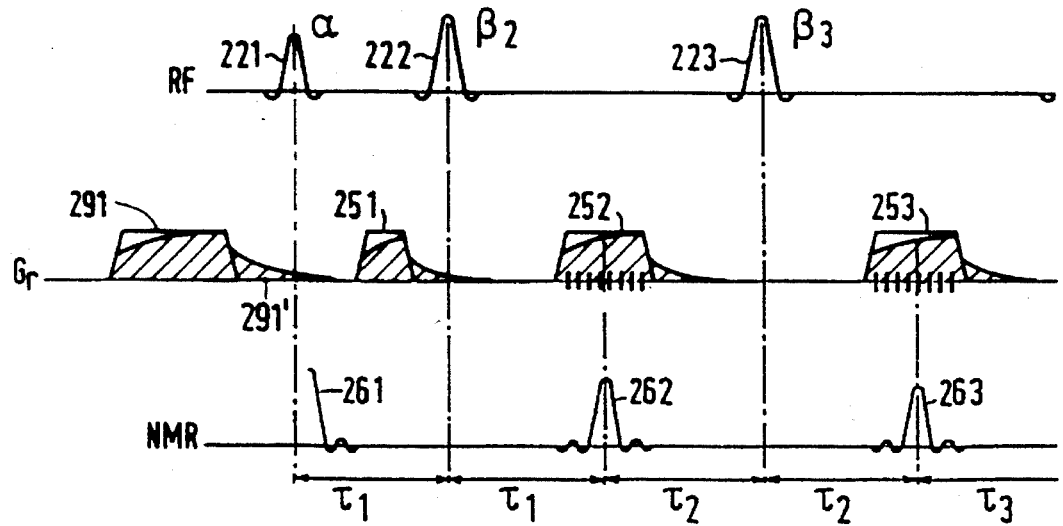
FIG. 4 the principle for compensation of the eddy current effects in accordance with the invention.

FIG. 4 illustrates the principle of the compensation of the eddy current fields according to the invention. Reference numbers are 200 larger than the reference numbers for comparable entities in FIG. 2. As in FIG. 3, the outlines indicate the ideal gradient pulse shapes as imposed by the gradient system with the shaded areas indicating the effective gradient pulse including the effects of eddy currents. The illustration is limited to a read sequence $G_r$, but applies in analogy to slice selection and phase encoding gradients as well. Prior to the excitation RF-pulse 221, an additional gradient field 291 is applied in the same direction as the read compensation and read gradients 251, 252, 253, etc. Due to eddy currents as described hereinbefore, the additional gradient field 291 has a tail of which a portion 291' extends across the excitation RF-pulse 221. According to the invention, the strength and position in time of the additional gradient field 291 is chosen such that portion 291' compensates for the loss, due to eddy currents, of time-integrated strength of the read gradient field 251 in the interval between the excitation RF-pulse 221 and the first refocusing RF-pulse 222. Consequently, the total time integrated strength between the excitation RF-pulse 221 and the first refocusing RF-pulse 222 is equal to the time-integrated strength that would be present in the absence of eddy currents. For the read gradients 252, 253 etc. compensation is assured due to the repetitive character of the sequence.

Figure 5:
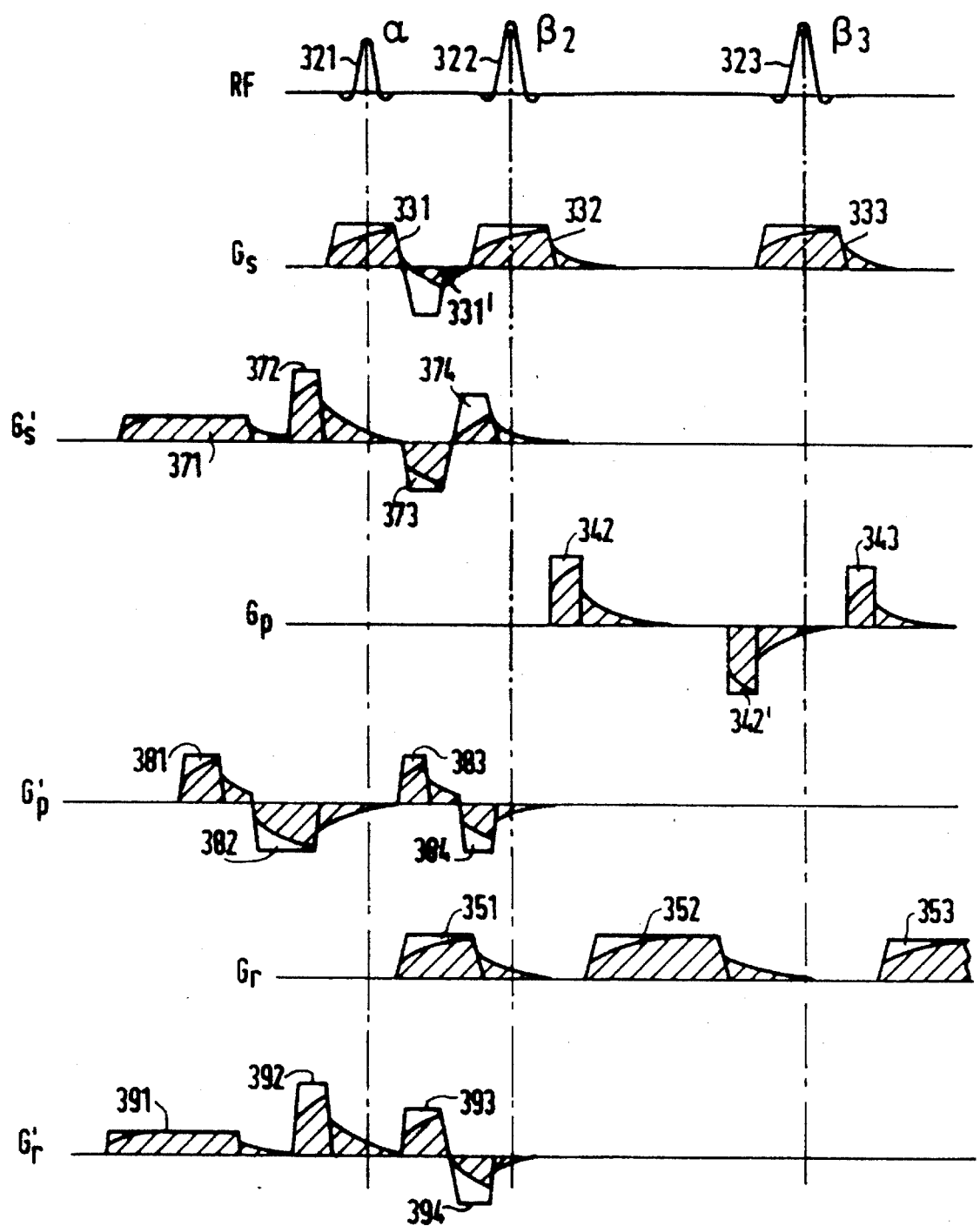
FIG. 5 the strength of gradient fields due to normal and additional gradient field pulses.

In FIG. 5 a practical embodiment of a slice selection sequence $G_s$, a phase encoding sequence $G_p$ and a read gradient sequence $G_r$ each, are illustrated in which additional gradient fields are added. Reference numbers for RF-pulses and gradient field pulses are 300 above the reference numbers for comparable entities in FIG. 2. For clarity, the additional fields are shown on separate lines $G_s'$, $G_p'$ and $G_r'$, respectively. As the additional gradient fields are in the same direction, and are generated using the same gradient system and coils, the additional gradients can be considered as a modification of the sequence of gradient field pulses and, for overlapping pulses, as a modification of the pulse shape of the gradient field pulses. As hereinbefore, in this figure the rectangular and trapezoid outlines give the ideal gradient pulse shape and the shaded areas indicate the effective gradient pulses including the effects of eddy currents.

In the slice selection sequence $G_s$ additional gradient fields 371 and 372 are added prior to the excitation RF-pulse 321. In the interval between the excitation RF-pulse and the first refocusing RF-pulse 322 further additional gradient fields 373 and 374 are added. The combined time integrated strength of the ideal pulse shapes of further additional gradient fields 373 and 374 is zero to satisfy the CPMG-condition. The use of several gradient field pulses 371–374, allows a larger number of degrees of freedom, as each gradient field pulse has a strength, a length and a position in time.

Analogous, in the phase encoding sequence $G_p$ additional gradient fields 381 and 382 of different polarity are added prior to the excitation RF-pulse 321 and a pair of additional gradient fields 383 and 384 with combined time-integrated strength equal zero is added in the interval between the excitation RF-pulse and the first refocusing RF-pulse 322. Also in the read sequence $G_r$ additional gradient fields 391 and 392 are added prior to the excitation RF-pulse 321, and a pair of further additional gradient fields 393 and 394, with net zero time-integrated strength are added in the interval between the excitation RF-pulse and the first refocusing RF-pulse.

Due to the large number of parameters it is possible to create a series of additional gradient fields that performs sufficiently well for eddy currents with a combined decay time in the range from about 4 to several hundreds of milliseconds, independent of the actual time of decay for the combined eddy current components that occurs in a particular MRI apparatus. To obtain such series of additional gradient fields the following procedure may be applied, by numerical calculation.

Firstly, for each gradient direction, i.e. slice selection, phase encoding or read direction, the phases of the nuclear dipole moments just prior to refocusing RF-pulses are calculated. The eddy currents are to be taken into account by assuming that a fraction a of the gradient fields contributes with a certain time-constant T. For a step function this would yield a gradient field $G(t)=0$, $t>0$; and $G(t)=1-a\cdot e^{-t/T}$, $t\leq 0$. The phase change of the nuclear dipole moments at a given location is proportional to the time-integrated strength of the gradient fields. Also the phase changes due to the RF-pulses have to be taken into account.

Secondly, additional gradient fields, as described in relation to FIGS. 4 and 5 are added. By means of an iterative and/or analytical procedure the positions and strength of the additional gradient fields is changed till the phases of the nuclear dipole moments are the same just before each refocusing RF-pulse. In this procedure several parameters can be fixed, for example the position in time or the maximum strength. A certain trade-off to remain within the physical limitation of the MRI apparatus is possible.

When the phase error is reduced to zero, all disturbances due to eddy currents with a time constant T are compensated for, irrespective the geometrical behaviour, or local variations, of the disturbances. As, usually, also other time constants will be present, a third step is necessary in which the additional gradients are further adapted to obtain a satisfactory compensation for another time constant $T_x$, without destroying the compensation for T. Such further optimization could be done analytically or numerically for a number of different time constants by which an overall optimum by means of a least square method could be found. However, it was found that a solution could be obtained with two time constants of about 4 ms and of a few times the interpulse spacing $2\tau_1$ respectively. This provides adequate compensation for time constants within this range as well.

The described procedure is effective for both the slice selection and the read gradients. In case of the phase encoding gradients it has to be taken into account that the phase encoding gradient changes in time-integrated strength from one NMR signal to the next. In case a complete measurement is split in several measurement sequences, each measurement sequence having a different range of phase encoding values, the additional gradients for eddy current compensation have to be adjusted for each such measuring sequence.

What is claimed is:

1. Method for magnetic resonance imaging of a body placed in a stationary and substantially homogeneous main magnetic field, the method including at least one measuring sequence comprising:

the application of an excitation RF-pulse for excitation of nuclear dipole moments in at least a portion of the body, the application of at least one refocusing RF-pulse following said excitation RF-pulse and switched gradient magnetic fields for generating position dependent magnetic resonance signals in the excited portion of the body, wherein the measuring sequence comprises one or more additional switched gradient magnetic fields having an imposed gradient shape such that the time-integrated strength between RF-pulses of said imposed gradient shape satisfies the CPMG condition that the phases of excited nuclear dipole moments are the same at each refocussing RF-pulse, said one or more additional switched gradient fields further being dimensioned for causing eddy currents such that the combined effects upon the phases of excited nuclear dipole moments due to eddy currents caused by switched gradient fields for generating position dependent signals and by said one or more additional switched gradient magnetic fields, time-integrated between a pair of RF-pulses, satisfies said CPMG condition.

2. Method according to claim 1, wherein one additional switched gradient magnetic field is applied prior to the excitation RF-pulse.

3. Method according to claim 1, wherein a plurality of additional switched gradient magnetic fields is applied prior to the excitation RF-pulse, the additional switched gradient magnetic fields having different strength and length.

4. Method according to claim 1, wherein a pair of additional switched gradient magnetic fields is applied in between RF-pulses, the additional switched gradient magnetic fields having opposite polarity.

5. Method according to claim 1, wherein the switched gradient magnetic fields comprise phase-encoding gradient magnetic fields of varying time-integrated strength, and wherein the additional switched gradient magnetic fields are adapted to the varying time-integrated strengths of the phase-encoding gradient magnetic fields.

6. Method according to claim 1, wherein the additional switched gradient magnetic field or fields are dimensioned for providing a compensation of eddy currents caused by said switched gradient fields for generating position dependent signals in which the eddy currents have decay time constants of about 4 milliseconds and more.

7. Apparatus for magnetic resonance imaging of a body placed in a stationary and substantially homogeneous main magnetic field, the apparatus comprising means for establishing a main magnetic field, means for generating gradient magnetic fields superimposed upon the main magnetic field, means for radiating RF-pulses towards a body placed in the main magnetic field, control means for steering the generation of the gradient magnetic fields and the RF-pulses, and means for receiving and sampling magnetic resonance signals generated by sequences of RF-pulses and switched gradient magnetic fields, said control means being arranged for applying an excitation RF-pulse (21) for excitation of nuclear dipole moments in at least a portion of the body, and for applying a plurality of refocusing RF-pulses following said excitation RF-pulse and switched gradient magnetic fields for generating position dependent magnetic resonance signals in the excited portion of the body, said control means being further arranged for applying one or more additional switched gradient magnetic fields, having an imposed gradient shape such that the time-integrated strength between RF-pulses of said imposed gradient shape satisfies the CPMG condition that the phases of excited nuclear dipole moments are the same at each refocussing RF-pulse, and said one or more additional switched fields further being dimensioned for causing eddy currents such that the combined effects upon the phases of excited nuclear dipole moments due to eddy currents caused by switched gradient fields for generating position dependent signals and by said additional switched gradient magnetic field or fields, time-integrated between a pair of RF-pulses, satisfies said CPMG condition.

8. Method according to claim 2, wherein a pair of additional switched gradient magnetic fields is applied in between RF-pulses, the additional switched gradient magnetic fields having opposite polarity.

9. Method according to claim 3, wherein a pair of additional switched gradient magnetic fields is applied in between RF-pulses, the additional switched gradient magnetic fields having opposite polarity.

10. Method according to claim 2, wherein the switched gradient magnetic fields comprise phase-encoding gradient magnetic fields of varying time-integrated strength, and wherein the additional switched gradient magnetic fields are adapted to the varying time-integrated strengths of the phase-encoding gradient magnetic fields.

11. Method according to claim 3, wherein the switched gradient magnetic fields comprise phase-encoding gradient magnetic fields of varying time-integrated strength, and wherein the additional switched gradient magnetic fields are adapted to the varying time-integrated strengths of the phase-encoding gradient magnetic fields.

12. Method according to claim 4, wherein the switched gradient magnetic fields comprise phase-encoding gradient magnetic fields of varying time-integrated strength (342, 343), characterised in that the additional switched gradient magnetic fields are adapted to the varying time-integrated strengths of the phase-encoding gradient magnetic fields.

13. Method according to claim 2, characterised in that the additional switched gradient magnetic field or fields (291, 371–374, 381–384, 391–394) are dimensioned for providing a compensation of eddy currents caused by said switched gradient fields for generating position dependent signals in which the eddy currents have decay time constants of about 4 milliseconds and more.

14. Method according to claim 3, characterised in that the additional switched gradient magnetic field or fields (291, 371–374, 381–384, 391–394) are dimensioned for providing a compensation of eddy currents caused by said switched gradient fields for generating position dependent signals in which the eddy currents have decay time constants of about 4 milliseconds and more.

15. Method according to claim 4, wherein the additional switched gradient magnetic field or fields are dimensioned for providing a compensation of eddy currents caused by said switched gradient fields for generating position dependent signals in which the eddy currents have decay time constants of about 4 milliseconds and more.

16. Method according to claim 5, wherein the additional switched gradient magnetic field or fields are dimensioned for providing a compensation of eddy currents caused by said switched gradient fields for generating position dependent signals in which the eddy currents have decay time constants of about 4 milliseconds and more.

* * * * *